United States Patent [19]

Kawaguchi

[11] Patent Number: 4,746,048

[45] Date of Patent: May 24, 1988

[54] PRINTED CIRCUIT BOARD JUMPER WIRE WIRING DEVICE

[75] Inventor: Seiji Kawaguchi, Tokyo, Japan

[73] Assignee: Apollo Seiko Ltd., Tokyo, Japan

[21] Appl. No.: 25,751

[22] Filed: Mar. 13, 1987

[30] Foreign Application Priority Data

Apr. 9, 1986 [JP] Japan .................................. 61-80222

[51] Int. Cl.⁴ .................................................. B23K 1/12
[52] U.S. Cl. ........................................ 228/5.1; 228/9;
29/850; 29/861
[58] Field of Search ..................... 228/5.1, 6.2, 9, 10,
228/13, 18; 29/850, 861

[56] References Cited

U.S. PATENT DOCUMENTS

| | | | |
|---|---|---|---|
| 3,960,309 | 6/1976 | Hazel | 228/5.1 |
| 4,230,925 | 10/1980 | Lascelles | 228/5.1 |
| 4,359,623 | 11/1982 | Fanning | 228/5.1 |

Primary Examiner—Nicholas P. Godici
Assistant Examiner—Richard K. Seidel
Attorney, Agent, or Firm—Schwartz & Weinrieb

[57] ABSTRACT

A device which can improve the efficiency of jumper wire wiring work through automatic coiling and soldering of both conductor parts of a jumper wire to selected pins of the multiple pins protruding from a printed circuit board. The device includes a setting finger for gripping the jumper wire and holding the same within the vicinity of the printed circuit board terminal or pin, a wrapping mechanism which includes an eccentrically mounted wrapping pin for engaging the conductor portion of the jumper wire and wrapping or coiling the same about the printed cirucit board terminal or pin, and a soldering mechanism for soldering the jumper wire conductor to the printed circuit board terminal or pin.

7 Claims, 10 Drawing Sheets

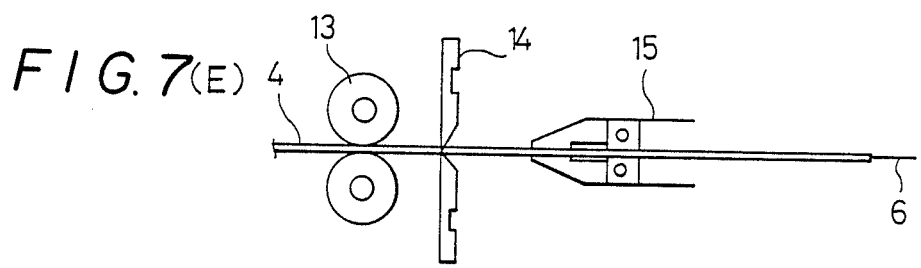
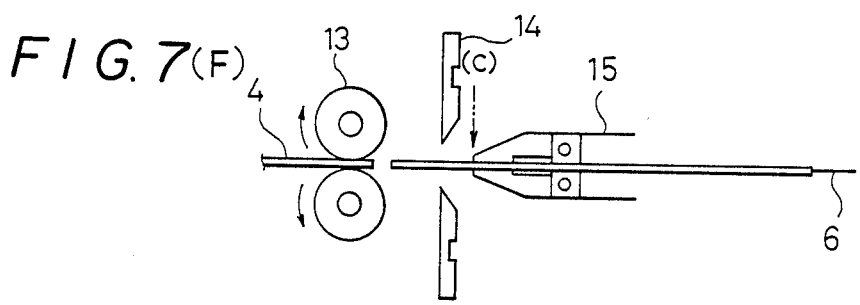
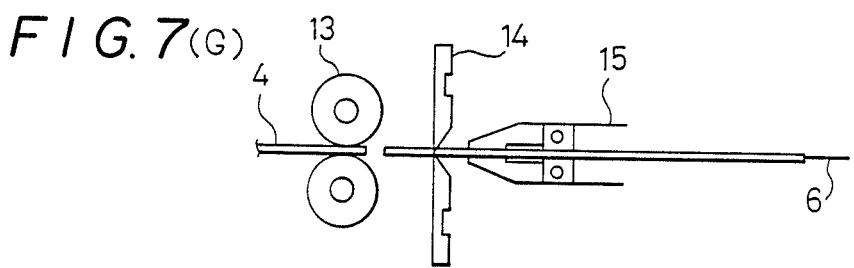
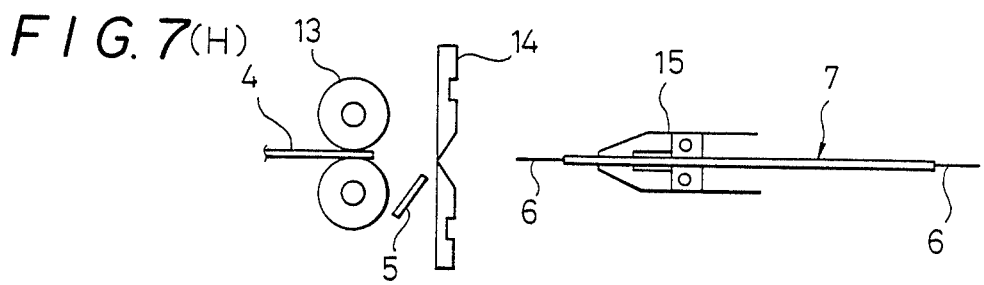

PRINTED CIRCUIT BOARD JUMPER WIRE WIRING DEVICE

FIELD OF THE INVENTION

This invention concerns a device for wiring jumper wires on printed circuit boards by soldering a jumper wire to any two selected pins of the multiple pins protruding from the printed circuit board.

BACKGROUND OF THE INVENTION

The wiring work of these jumper wires demands extremely fine and delicate work, executed with a certain degree of skill. Furthermore, the connection of only certain specified pins of the multiple pins available has in the past involved a lot of improper wiring and poor work efficiency.

SUMMARY OF THE INVENTION

This invention, having noted the prior art, automates the process of jumper wire wiring and increases the efficiency and accuracy of the work.

BRIEF DESCRIPTION OF THE DRAWINGS

The many characteristics and advantages of this invention will be clarified in the following detailed description which makes reference to the attached drawings, wherein:

FIGS. 7(A) through 7(H) are side views showing the cutting and cover peeling operations of the lead wires.

PREFERRED EMBODIMENTS OF THE INVENTION

Figure 1:
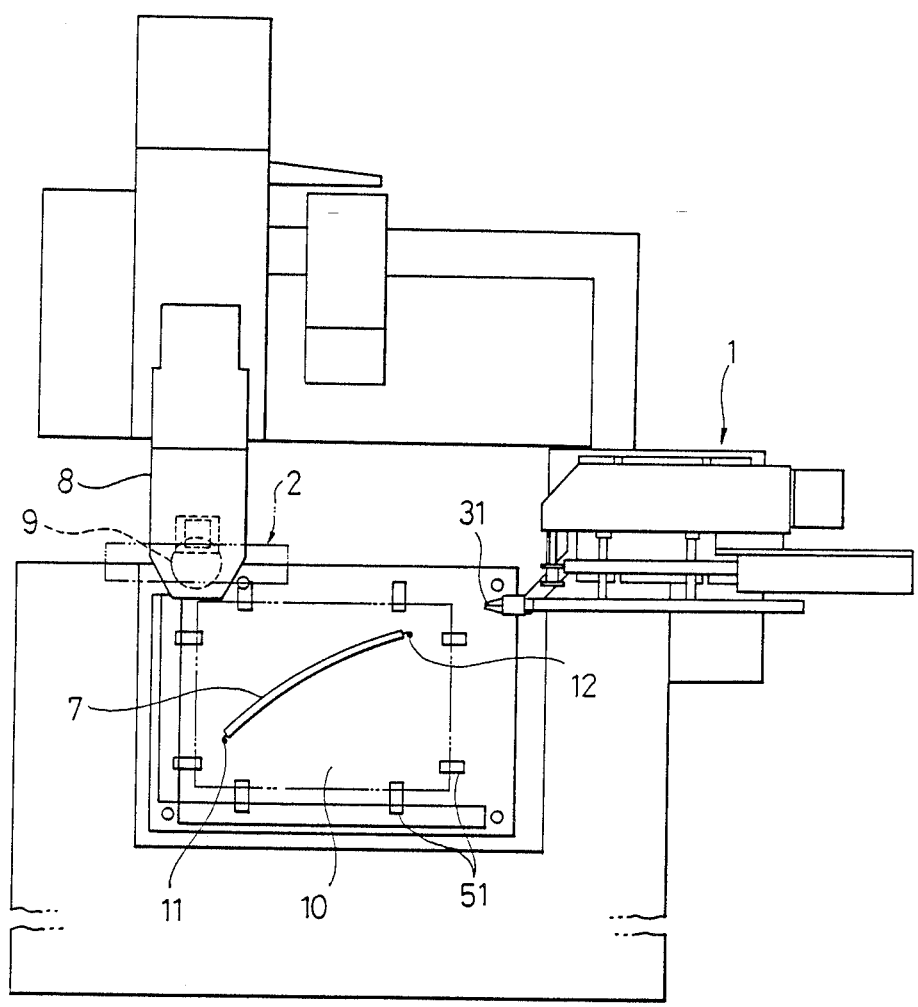
FIG. 1 is a plan view of the first embodiment of this invention showing a system which combines a printed circuit board jumper wire wiring device and a jumper wire supply device.
Figure 2:
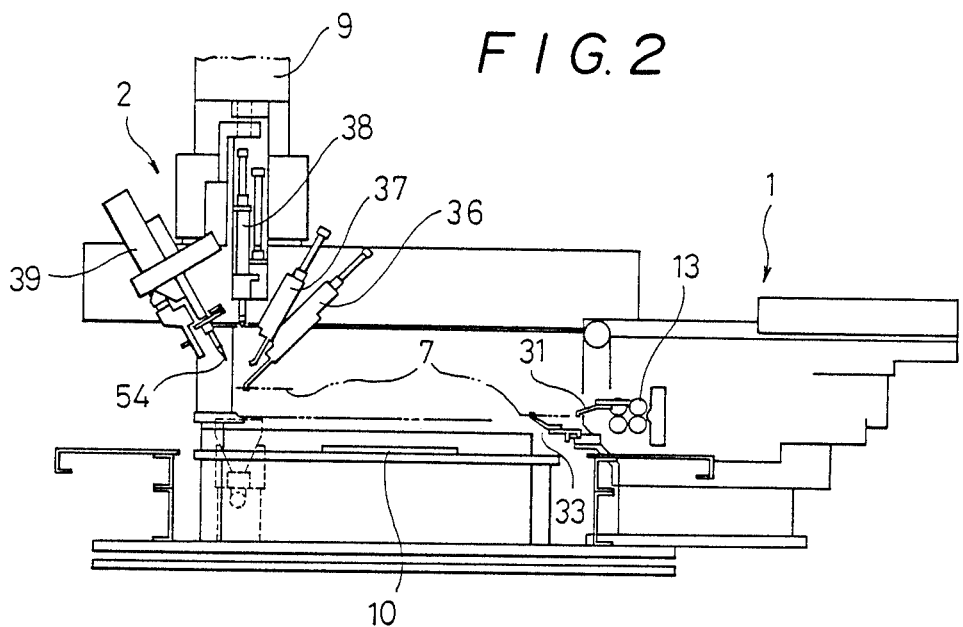
FIG. 2 is a side view of the system shown in FIG. 1.
Figure 4:
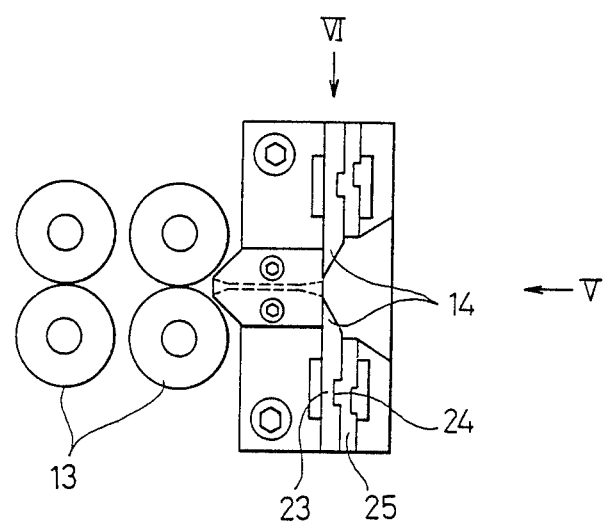
FIG. 4 is a side view showing the construction of the area around the cutters.
Figure 3:
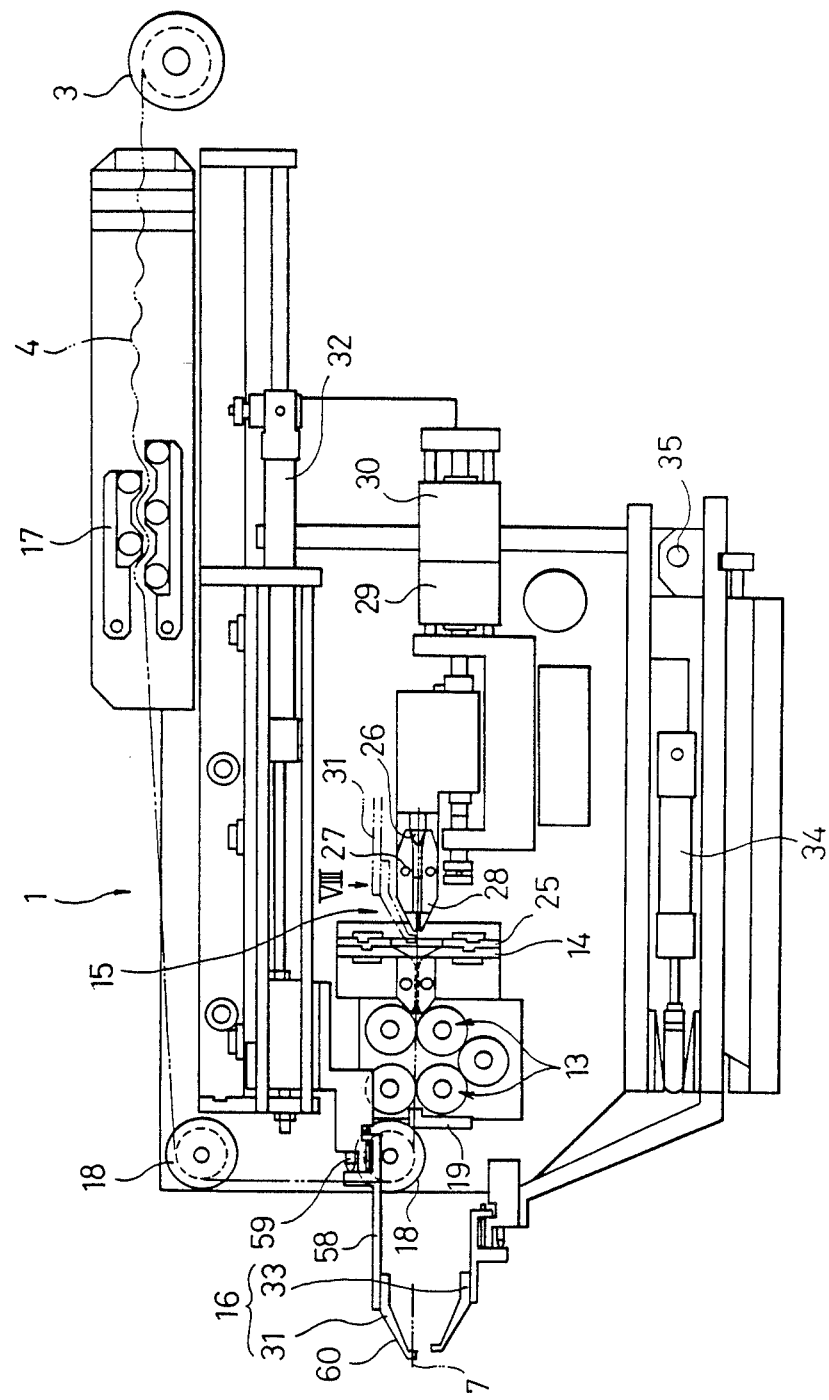
FIG. 3 is an overall side view of the jumper wire supply device.

The following description outlines the preferred embodiment of this invention as shown in FIGS. 1 through 3.

Before describing the printed circuit board jumper wire wiring system, the entire device which is constructed by combining this jumper wire wiring device 2 with a jumper wire supply device 1 will be described.

The jumper wire supply device 1 which is combined with this jumper wire wiring device 2 is constructed from pinch rollers 13, cutters 14, a grip 15, and a supply finger 16, as best seen in FIG. 3. The two lead wires 4 are guided in parallel from the take-up reel 3 into this device, and first pass through the wire drawing unit 17. The lead wires 4 are longitudinally compressed by the drawing unit 17, and the slackened lead wires 4 are tensioned. In addition to the wire drawing unit 17 which compresses the wires from above and beyond, another wire drawing unit may be attached so as to compress the wires in the horizontal direction. Also there may be only one lead wire 4 introduced to the jumper supply device 1 instead of two.

Figure 10:
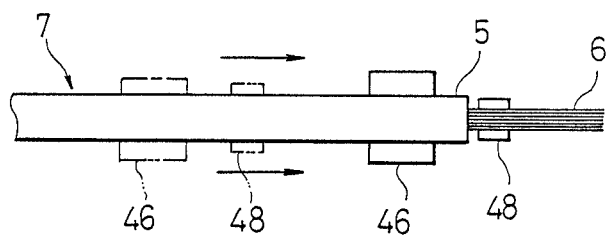
FIG. 10 is an expanded view of the lead wire showing the conductor part as detected by the sensor finger.
Figure 11:
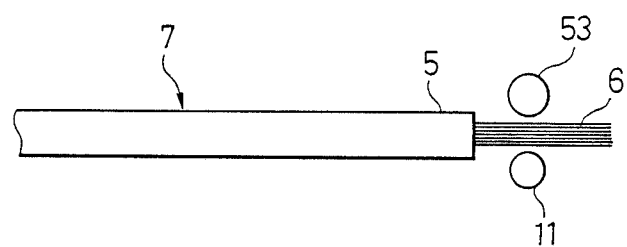
FIG. 11 is an expanded plan view of the lead wire showing the lead wire before it is coiled around the pin.
Figure 12:
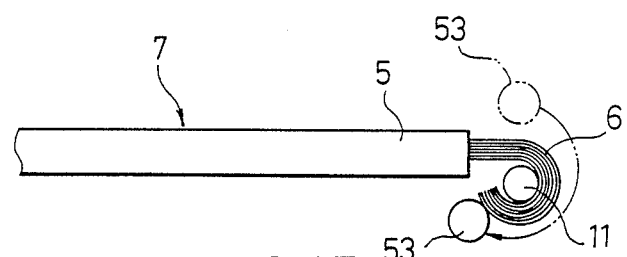
FIG. 12 is an expanded side view corresponding to FIG. 11 but following coiling of the lead wire.
Figure 13:
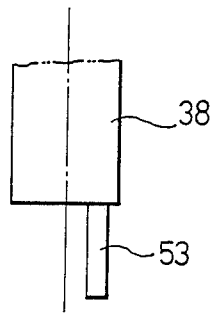
FIG. 13 is an expanded side view showing the wrapping pin.

The direction of the lead wire 4 which has passed through the wire drawing unit 17 is transposed 180 degrees by means of the two feed rollers 18, and guided into the two sets of pinch rollers 13. These pinch rollers 13 can rotate in the forward or reverse directions, and therefore feed and rewind the lead wire 4 as required for cutting the lead wires 4 or peeling off the covering 5, as seen in FIGS. 10–12 from both ends. The lead wires 4 are interposed between the upper and lower cutters 14 by the pinch rollers 13. 19 is a curve assisting guide which by keeping the lead wire 4, fed by the pinch rollers 13, in an accurate position, ensures that the lead wire 4 does not bend after passing through the pinch rollers 13.

Figure 5:
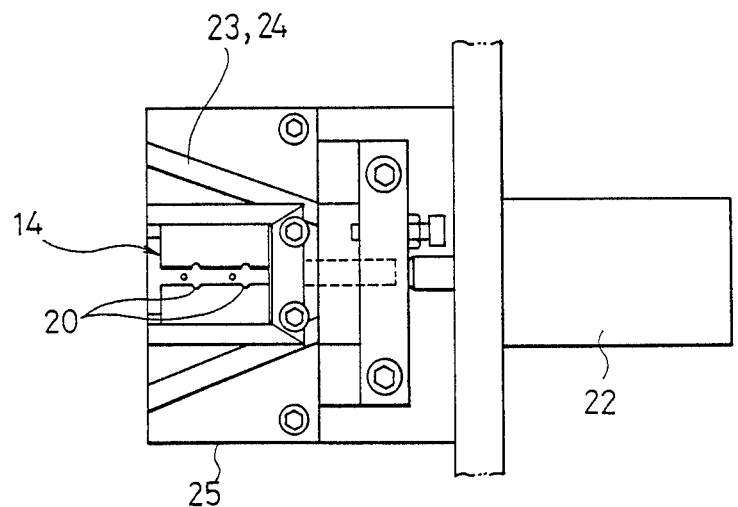
FIG. 5 is a side view from the direction of the arrow V in FIG. 4.
Figure 6:
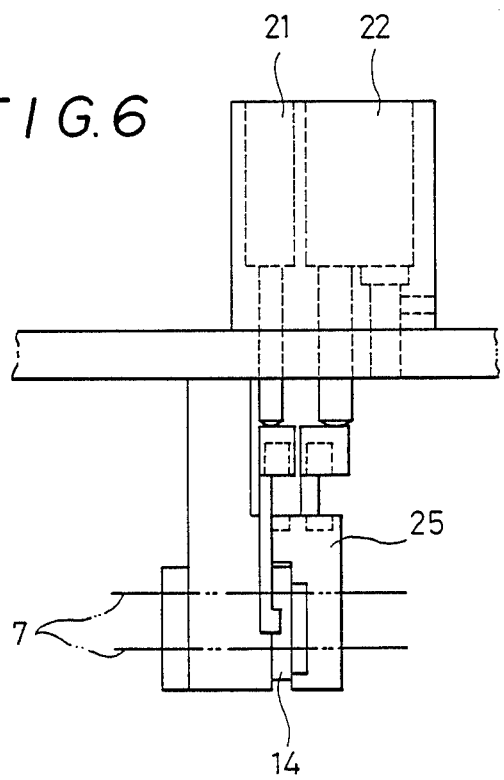
FIG. 6 is a plan view from the direction of the arrow VI in FIG. 4.

The cutting edges of these cutters 14 are constructed of two laterally spaced concave cutting parts 20, as best seen in FIG. 5, for peeling off the covering 5. The size of these concave cutting parts 20 corresponds to the thickness of the conductor part 6 of the lead wire 4. The cutters 14 can move horizontally and vertically using the slide cylinder 21, as best seen in FIG. 6, thus adjusting the position of the concave cutting parts 20 in relation to the lead wire 4. These concave cutting parts 20 are used to peel off the wire covering 5, the lead wire 4 being cut in places other than at and by the concave cutting parts 20. These cutters 14 are moved vertically by the cutting cylinder 22 so as to achieve, in effect, open and closed positions. In other words, each cutter 14 has a sloping concave part 23, and the cutter moves vertically in a reciprocating manner as the cutting cylinder 22 moves the frame 25 which has a convex part 24 that fits into this concave part 23, in a forwards-backwards direction (in the left to right direction as seen in FIG. 5). Consequently, horizontal reciprocating motion of frame 25 causes vertical reciprocating movement of the cutters 14.

The grip 15 closes the ends of its claws 28 so as to grip the lead wire 4 as a result of the insertion of the arrowhead piston 26 between the rear end of the pair of claws 28 causes the claws 28 to rotate around a fulcrum 27 which is disposed at the center of the claws 28. Furthermore, the grip 15 can be moved to three longitudinal positions (a), (b), (c), shown in FIGS. 7(A) through (H), in relation to the cutters 14 through the action of the two back-to-back cylinders 29 and 30 as seen in FIG. 3.

The supply finger 16 grips the jumper wire 7 as a result of the insertion of another piston 59 with the same shape as the said piston 26 between the pair of opposed support arms 58 which pivot around a fulcrum, thus opening and closing the pair of fingers 60 provided on the tips of those supply arms 58, in the same manner as the grip 15 as described above.

The following paragraphs describe the operation of these cutters 14 and the grip 15 which is adjacent to the cutters 14, in cutting a lead wire 4 and removing its covering 5, with reference to FIGS. 7(A) through 7(H).

(1) A specified length of lead wire 4 is fed by the forward rotation of the pinch rollers 13 and its leading edge (one end) is positioned between the upper and lower cutters 14. At this time the cutters 14 are adjusted so that a concave cutting part 20 is aligned with the lead wire 4. At this point the grip 15 is in position (a) (FIG. 7(A)).

(2) The cutters 14 move up and down so as to cut only the covering 5 of the one end of the lead wire 4. (FIG. 7(B)).

Figure 7A:
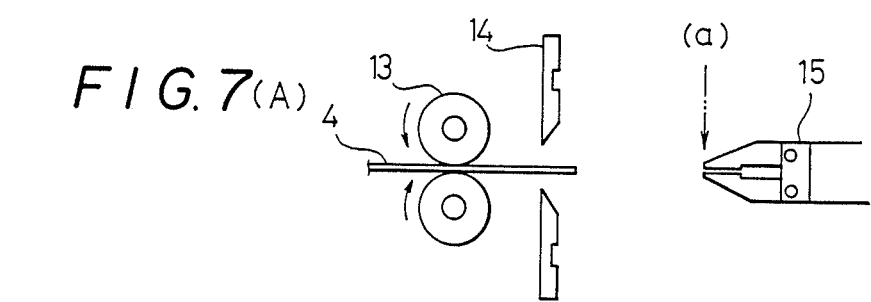
Figure 7B:
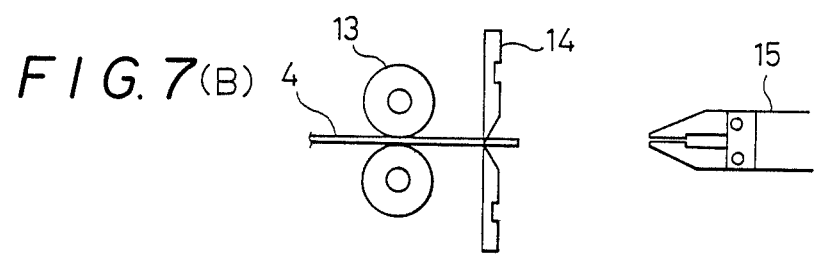
Figure 7C:
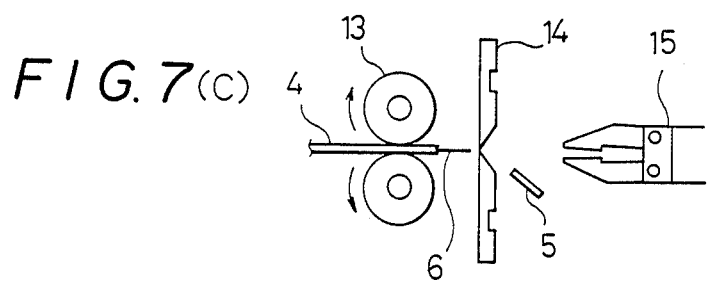
Figure 7D:
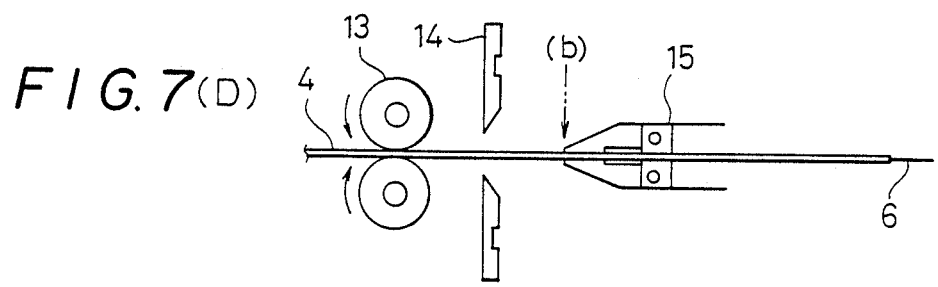

(3) The pinch rollers 13 rotate in the reverse direction, moving the lead wire 4 slightly to the left in FIG. 7(C), peeling off the covering 5 which was just cut, and exposing one end of the conductor part 6. (FIG. 7(C)).

(4) The pinch rollers 13 again rotate in the forward direction and feed the required amount of lead wire 4. Then the grip 15 moves horizontally—to the left in FIG. 7(D)—and grips and holds the fed lead wire 4 at position (b). At this point the cutters 14 have already been moved horizontally so that a part other than the concave cutting part 20 is aligned with the lead wire 4. It is always possible to properly align the wire 4 and cutters 14 no matter what length of wire has been fed, because the direction of the lead wire 4 has been transposed 180 degrees by the feed rollers 18 (FIG. 7(D).)

(5) The cutters 14 vertically reciprocate together and apart with respect to each other and cut the lead wire 4 in the middle so as to form another end of the lead wire 4 oppposite that of the one end already formed. Immediately after this cutting operation, the cutters 14 move horizontally, so as to align a concave cutting part 20 with the lead wire 4. (FIG. 7(E)).

(6) The grip 15 is moved slightly horizontally—to the left in FIG. 7(F)—to position (c), and the other end of the cut lead wire 4 is positioned between the cutters 14. (FIG. 7(F)).

(7) The cutters 14 move together so as to and cut only the covering 5 of the other end of the lead wire 4. (FIG. 7(G)).

(8) The grip 15 is moved back to position (a), peeling off the covering 5 which was just cut, and exposing the conductor part 6 of the other end of the lead wire. At this point the desired jumper wire 7 has been obtained (FIG. 7(H).

Figure 8:
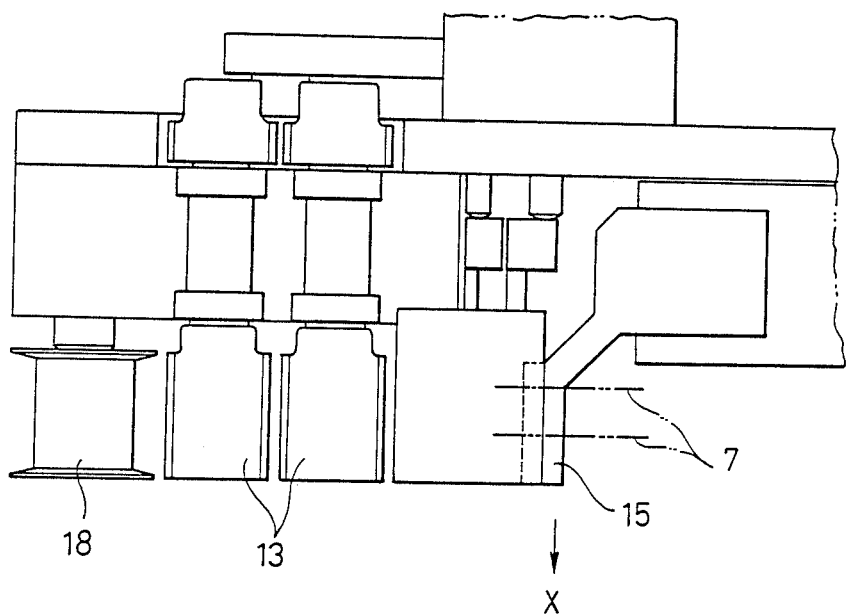
FIG. 8 is a plan view viewed from the direction of the arrow VIII in FIG. 3.
Figure 9:
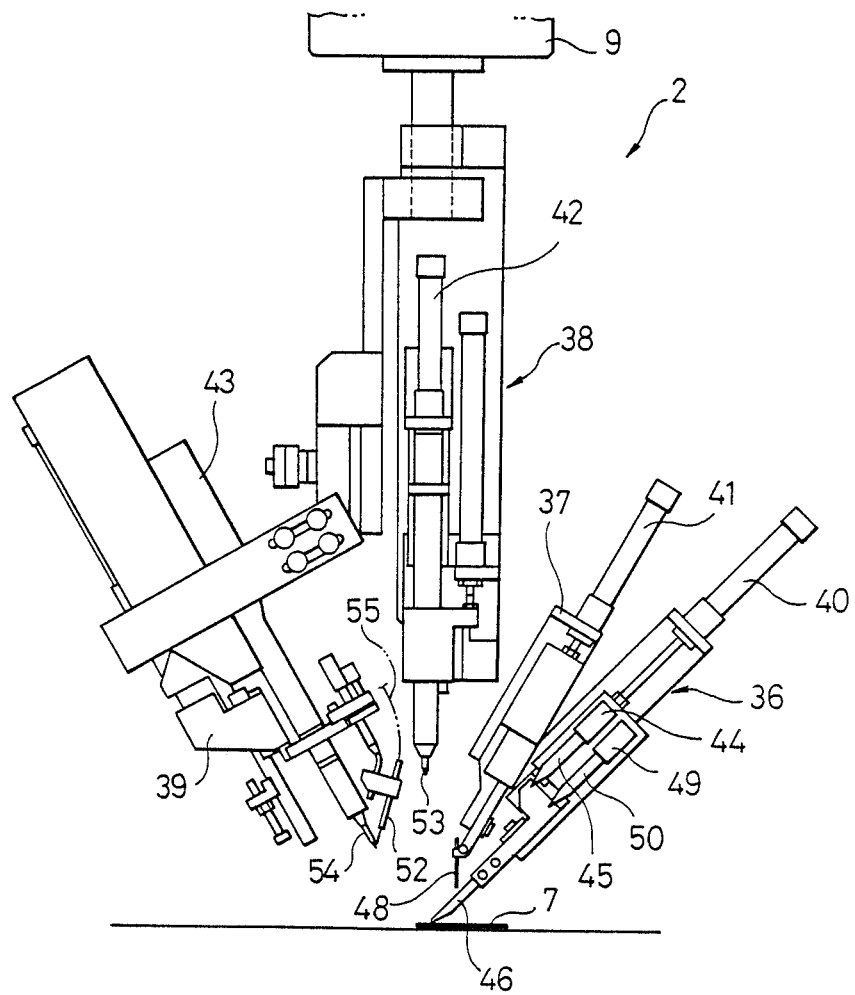
FIG. 9 is an overall side view showing the jumper wire wiring device of the first embodiment of this invention.

The above described the cutting of a single lead wire 4 and the peeling of its covering 5 by the cutters 14 and the grip 15. When two lead wires 4 are fed simultaneously from the take-up reel 3, the grip 15 is moved horizontally in the direction of arrow X in FIG. 8 so as to hold the two jumper wires 7 thus simultaneously derived. The upper finger 31 which is one of the supply fingers 16 is moved backwards via its cylinder 32 so as to grip the jumper wire 7 which is held by the grip 15 which was moved horizontally, and then the upper finger returns to its forward position. Next the jumper wire 7 is passed from the upper finger 31 to the lower finger 33. In order to pass the jumper wire from the upper finger 31 to the lower finger 33, the whole device is inclined forwards about the hinge 35 as a result of the extension-contraction of the cylinder 34 which is attached to the lower part of the device. Then at this point, the jumper wire wiring device 2 described below is switched into ready status. The construction of the upper and lower fingers 31 and 33 is almost identical to that of the supply finger 16 described already and so has been omitted here.

Next, we will describe in detail the jumper wire wiring device 2 of this invention, with reference to FIGS. 9 through 13.

The entire jumper wire wiring device 2 is mounted on the head 9 of a freely movable and rotating robot arm 8, as seen in FIG. 1, and comprises a setting finger 36, a sensor finger 37, a wrapping mechanism 38 and a soldering mechanism 39. Each of these move vertically independently via individually provided cylinders 40, 41, 42, and 43, which radiate outwardly from the wrapping mechanism 38 which is disposed in the upper center position.

The entire jumper wire wiring device 2 moves towards the jumper wire supply device 1 through means of the movement of the robot arm 8, and one end of the jumper wire 7 which was held by the lower finger 33 is transferred to the grip of the setting finger 36 as if the upper finger 31 was holding it.

With the setting finger 36 holding one end of the jumper wire 7, the entire jumper wire wiring device 2 is moved by the robot arm 8 to the printed circuit board 10 which is fixed by means of the positioning tool 51, and the conductor part 6 of the jumper wire 7 is positioned immediately next to one of the pins 11 to be soldered. Next, the wrapping mechanism 38 is moved downwardly and the conductor part 6 of the jumper wire 7 is held between the wrapping pin 53 positioned at the lower end of the wrapping mechanism 38 and the pin 11 on top of the printed circuit board 10. (FIG. 11). The wrapping pin 53 is mounted eccentrically with respect to the front edge of the wrapping mechanism 38 (See FIG. 13). Thus the conductor part 6 is coiled around pin 11 as a result of the rotation of the wrapping pin 53 in the specified direction, that is, its planetary rotation in the clockwise direction around the circumference of pin 11 (See FIGS. 11 and 12).

Once the conductor part 6 has been coiled around the pin 11, the soldering mechanism 39 descends and the solder iron tip 54 is moved into contact with pin 11 around which the conductor part 6 is coiled. Thread solder 55 is automatically supplied from a supply nozzle 52 to the iron tip 54 and soldering is performed automatically. This completes the soldering of one end of the jumper wire 7.

Next, the head 9 rotates 180 degrees so as to be disposed in the opposite direction, and the setting finger 36 descends together with the sensor finger 37 and lightly grips the the jumper wire 7 of which one end has already been soldered, at the opposite end from which it was previously held.

This light grip is obtained by the shallow insertion of the arrowheaded piston 45 of the cylinder 44 between the rear ends of a pair of claws 46. At this point, the sensor finger 37 descends and lightly grips the jumper wire 7 together with the setting finger 36 but slightly towards the front of the wire. Then, both this sensor finger 37 and the setting finger 36 move together, quickly, while still holding the jumper wire 7, toward a position forward of the opposite end of the jumper wire 7. Close to the conductor part 6 of the other end, the sliding motion is slowed, and when the sensor finger 37 reaches part of the conductor part 6 (see FIG. 10), the claw 48 of the sensor finger 37 passes onto the conductor part 6 of the other end of the jumper wire 7, thus detecting its position. Once its position is detected, a signal is transmitted to a control part, not shown in the diagram, and the arrowheaded piston 50 of the other cylinder 49 in the setting finger 36 is inserted, this time with force, deep between the ends of the claws 46. Then the ends of the claws 46 close, holding the other end of the jumper wire 7 tightly in a fixed position. Once the setting finger 36 has a tight held on the jumper wire 7, the role of the sensor finger 37 is complete, and it is moved away.

After that, the conductor part 6 of jumper wire 7 is positioned immediately next to pin 12 which has not yet been solered and is then coiled and soldered as outlined above. In this way the jumper wire 7 is soldered to the two pins 11, 12 on the printed circuit board, thus completing the wiring of the jumper wire 7.

In the above description, the position of the conductor part 6 was detected using the sensor finger 37; however, an optical sensor can also be used, or the distance which the setting finger 36 must be moved can be matched in advance with the length of the jumper wire 7, and the device set up to move only that fixed distance to grip the other end of the jumper wire 7.

Figure 14:
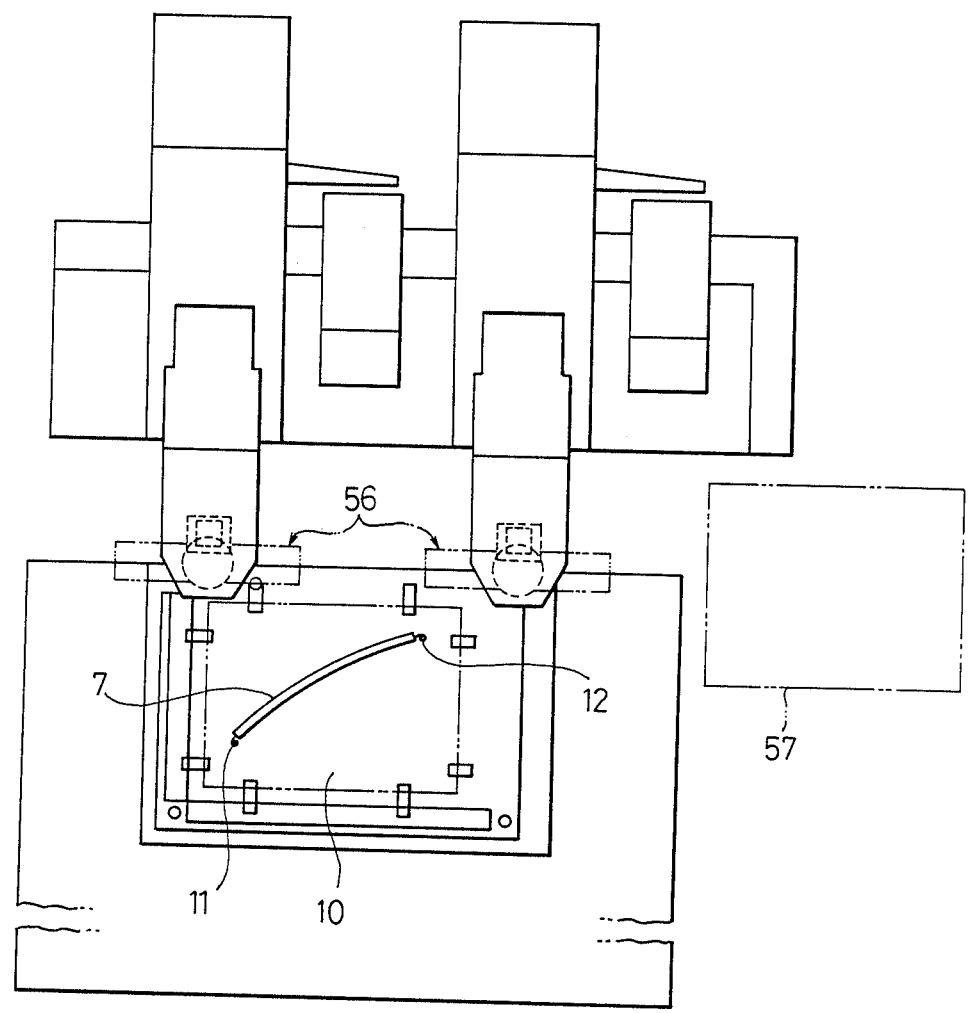
FIG. 14 is a side view, corresponding to FIG. 1, of another embodiment of this invention.

FIG. 14 shows another embodiment of this invention. This embodiment is provided with two jumper wire wiring devices 56. These two jumper wire wiring devices 56 grip and extract both ends of the jumper wire 7 from an existing wiring feeder 57 at once, and gripping those ends, convey them to any optional pins 11, 12 on the printed circuit board 10. After setting both ends in position at the two pins 11 and 12, coiling and soldering are performed simultaneously on the pins 11 and 12. This makes the wiring work even more efficient.

The printed circuit board jumper wire wiring device of this invention, as outlined in the description above, can automatically provide a soldered connection between any optional two pins on the printed circuit board using a prepared jumper wire. In this way, by automating jumper wire wiring work which previously could only be done manually, it is now possible to perform more wiring work both accurately and quickly.

Obviously, many modifications and variations of the present invention are possible in light of the above teachings. It is therefore to be understood that within the scope of the appended claims, the present invention may be practiced otherwise than as specifically described herein.

I claim:

1. A printed circuit board jumper wire wiring device for connecting a jumper wire to two pins of a printed circuit board, comprising:

setting finger means for gripping each end of said jumper wire and for respectively positioning both ends of said jumper wire within the vicinity of said two pins of said printed circuit board to which said jumper wire ends are to be soldered, respectively;

a wrapping mechanism which has at its end a wrapping pin means for coiling a conductor part of each end of said jumper wire around each of said pins of said printed circuit board; and a soldering mechanism for soldering each of said coiled conductor parts to each of said pins of said printed circuit board.

2. The printed circuit board jumper wire wiring device of claim 1 wherein:

said wrapping pin means is mounted off-center upon the front of said wrapping mechanism and rotates in a circular orbit about the axis of said wrapping mechanism while pressing said conductor part of each end of said jumper wire against and around each of said pins of said printed circuit board to which said jumper wire is to be soldered.

3. The printed circuit board jumper wire wiring device of claim 1, wherein:

said setting finger means, said wrapping mechanism, said soldering mechanism, and a sensor finger are mounted independently upon individual cylinders for free vertical up and down movement in radial directions about a substantially central point defined by said printed circuit board.

4. The printed circuit board jumper wire wiring device of claim 1, further comprising:

means for causing a sensing finger means and said setting finger means to lightly grip said jumper wire of which one conductor end has already been coiled around a first pin of said printed circuit board, wherein said sensor finger means lightly grips a part of said wire which is disposed slightly towards the other end of said wire with respect to the part lightly gripped by said setting finger means;

means for causing said setting finger means and said sensor finger means to move quickly towards said other end of said jumper wire;

means for detecting said conductor part at the other end of said wire so as to reduce the speed of, and stop, said movement of said sensor finger means and said setting finger means;

means for transmitting a signal to said setting finger means in response to said detected other end of said conductor for causing said setting finger means to strongly grip said other end of said jumper wire in preparation for wrapping and soldering said other end of said jumper wire, by said wrapping mechanism and said soldering mechanism, to a second pin of said printed circuit board; and means for moving said sensor finger means away from said jumper wire.

5. The printed circuit board jumper wire wiring device as set forth in claim 4, further comprising:

means for causing said setting finger means to selectively lightly or strongly grip said jumper wire.

6. The printed circuit board jumper wire wiring device as set forth in claim 5, wherein said gripping means comprises:

a pair of claws for gripping opposite portions of said jumper wire;

piston means selectively insertable between first ends of said claws for causing opposite second ends of said claws to close about said jumper wire.

7. The printed circuit board jumper wire wiring device as set forth in claim 1, wherein:

said wiring device is mounted upon the head of a freely movable and rotatable robot arm.

* * * * *

UNITED STATES PATENT AND TRADEMARK OFFICE
CERTIFICATE OF CORRECTION

PATENT NO. : 4,746,048
DATED : MAY 24, 1988
INVENTOR(S) : SEIJI KAWAGUCHI

It is certified that error appears in the above-identified patent and that said Letters Patent is hereby corrected as shown below:

Column 3, line 43, delete "and".

Column 5, line 8, change "held" to --hold--;

line 13, correct the spelling of "soldered".

Signed and Sealed this

Twenty-ninth Day of June, 1993

Attest:

MICHAEL K. KIRK

*Attesting Officer*      *Acting Commissioner of Patents and Trademarks*